United States Patent [19]
Tsujimoto et al.

[11] Patent Number: 5,097,287
[45] Date of Patent: Mar. 17, 1992

[54] IMAGE FORMING APPARATUS

[75] Inventors: Yoshiharu Tsujimoto; Hidenobu Yamane, both of Yamatokoriyama; Kunio Ohashi, Nara; Eiichi Kido, Yamatokoriyama, all of Japan

[73] Assignee: Sharp Corporation, Osaka, Japan

[21] Appl. No.: 585,294

[22] Filed: Sep. 19, 1990

[30] Foreign Application Priority Data

Sep. 22, 1989 [JP] Japan .................. 1-247505

[51] Int. Cl.⁵ .............................. G03B 27/32
[52] U.S. Cl. ........................ 355/27; 355/67
[58] Field of Search ............... 355/27, 28, 67; 430/138

[56] References Cited

U.S. PATENT DOCUMENTS

| | | | |
|---|---|---|---|
| 4,399,209 | 8/1983 | Sanders et al. | 430/138 |
| 4,760,010 | 7/1988 | Takagi | 430/138 |
| 4,760,426 | 7/1988 | Taniguchi et al. | 355/27 |

FOREIGN PATENT DOCUMENTS

| | | |
|---|---|---|
| 59-30537 | 2/1984 | Japan . |
| 64-29845 | 1/1989 | Japan . |
| 64-52143 | 2/1989 | Japan . |

*Primary Examiner*—Brian W. Brown
*Assistant Examiner*—Khanh Dang
*Attorney, Agent, or Firm*—David G. Conlin; Robert M. Asher

[57] ABSTRACT

An image forming apparatus comprising an optical device for forming a latent image on a photo and pressure sensitive sheet coated with microcapsules in which at least a photocuring material and a dyestuff are enveloped, a pressure developing device for superposing the photo and pressure sensitive sheet on which the latent image is formed on an image receiving sheet and breaking uncured microcapsules by pressure to form images on the image receiving sheet through use of the dyestuff, a light source for irradiating light on the image receiving sheet developed by the pressure developing device and a discharge device for discharging the image receiving sheet on which the light from the light source is irradiated to the outside.

5 Claims, 2 Drawing Sheets

IMAGE FORMING APPARATUS

BACKGROUND OF THE INVENTION

1. Field of the Invention

The present invention relates to image forming aparataus for forming images by means of a photo and pressure sensitive sheet formed by applying microcapsules in which a photocuring material, a dyestuff and the like are sealed on a carrier, and more particularly to means for treating an image receiving sheet after development.

2. Description of the Prior Art

For example, Japanese Patent Unexamined Publication Nos. SHO 59-30537 and 64-29845 disclose a method comprising steps of uniformly dispersing and applying microcapsules in which a photocuring material, a dyestuff and like are sealed on a carrier to form a photo and pressure sensitive sheet, forming images on the photo and pressure sensitive sheet to be exposed and superposing the photo and pressure sensitive sheet on an imaage receiving sheet to form images. Typical ones of the photocuring materials comprise prepolymers of acrylic or metacrylic polymers, or their monomers and optional photopolymerization initators which can initiate polymerization by light.

When the photocuring materials are polymerized, the resulting resins are almost harmless. However, monomers are often harmful to a human body. By way of example, the monomers are irritative. If the monomers come in touch with a user's skin, a blister, an eruption or a rash often appears on the skin. Therefore, the monomers must be prevented from coming in touch with the human body. In a conventional image forming apparatus, the monomers flowed out of the microcapsules in pressure treatment remain on the image receiving sheet as they are and the image receiving sheet is discharged to the outside of the body. Therefore, there is a great risk that the monomers directly come in touch with the user's skin.

There has been also proposed a method in which the image receiving sheet is fully heated after the pressure treatment so that the monomers on the image receiving sheet are vaporized. In this case, however, a running cost for heating is increased and further the apparatus must be large-sized for high heating.

SUMMARY OF THE INVENTION

The present invention provides an image forming apparatus comprising optical means for forming a latent image on a photo and pressure sensitive sheet coated with microcapsules in which at least a photocuring material and a dyestuff are enveloped, pressure developing means for superposing the photo and pressure sensitive sheet on which the latent image is formed on an image receiving sheet and breaking uncured microcapsules by pressure to form images on the receiving sheet by means of the dyestuff, a light source for irradiating light on the image receiving sheet developed by the pressure developing means and discharge means for discharging the image receiving sheet on which the light from the light source is irradiated to the outside.

The image forming apparatus of the present invention comprises a light source for irradiating the light on the developed image receiving sheet in addition to the conventional pressure developing means. In other words, the light source is provided between the pressure developing means for pressurizing the photo and pressure sensitive sheet and the image receiving sheet and the discharge means for discharging the image receiving sheet to the outside of the image forming apparatus.

Consequently, the monomers flowed onto the image receiving sheet together with the dyestuff by pressure at the time of developing can be polymerized and the toxicity thereof can be conteracted.

DETAILED DESCRIPTION OF PREFERRED EMBODIMENT

Figure 1:
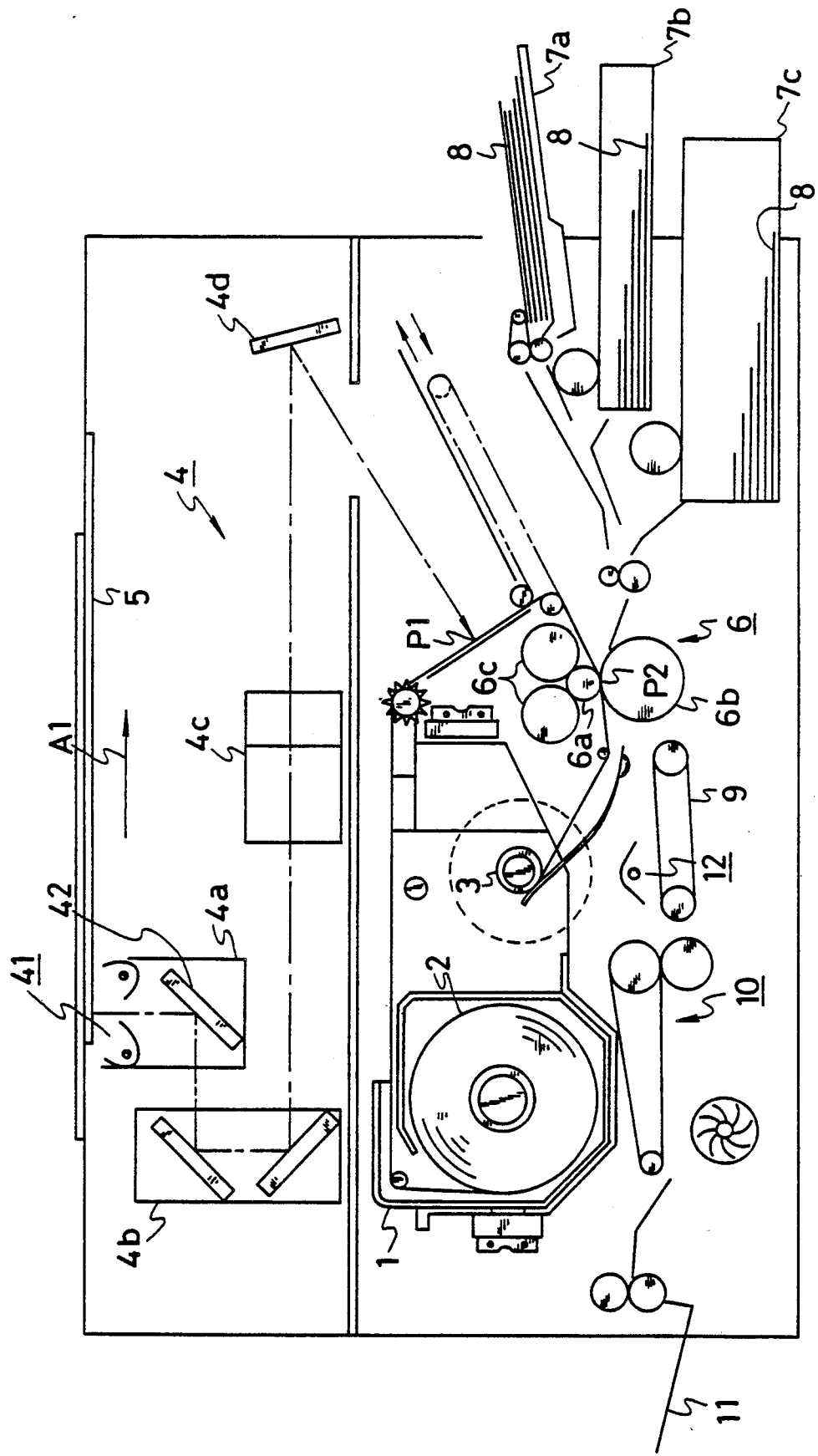
FIG. 1 is a schematic front view of a copying machine of an embodiment according to the present invention.

FIG. 1 is a schematic front view of a copying machine for forming images by means of a photo and pressure sensitive sheet and an image receiving sheet.

The copying machine has a media cartridge 1 provided on the left side in the central portion thereof. The media cartridge 1 has a rolled photo and pressure sensitive sheet 2 housed therein. The photo and pressure sensitive sheet 2 is formed by applying on a carrier like a sheet microcapsules in which a photocuring material, a dyestuff, a photopolymerization initiator and a sensitizer are sealed. A photo and pressure sensitive sheet disclosed in Japanese Patent Unexamined Publication No. SHO 59-30537 may be used as the photo and pressure sensitive sheet 2.

The media cartridge 1 protects the unused photo and pressure sensitive sheet 2 from external light and pressure. The photo and pressure sensitive sheet 2 is drawn out of the media cartridge 1 and then wound up onto a winding shaft 3 provided on the media cartridge 1 through an exposed portion P1 and a pressure developing portion P2. The light reflected by an original (image forming light) is directed to the exposure portion P1 through an optical system 4 provided on the top of the copying machine body.

The optical system 4 comprises an optical unit including a light source unit 4a having a light source 41 and a mirror 42, a mirror base 4b having two mirrors, a lens 4c and a fixed mirror 4d. The copying machine has an original platen 5 provided on the top surface thereof. The original to be copied is placed on the original platen 5. The light source unit 4a and the mirror base 4b reciprocate in a direction of an arrow A1 to scan the original and direct the reflected light to the photo and pressure sensitive sheet 2 of the exposure portion P1 through the lens 4c and the fixed mirror 4d. Consequently, some of the microcapsules on the photo and pressure sensitive sheet 2 are struck by the light and cured (polymerized) to form latent images.

The pressure developing portion P2 includes a pressure developing device 6. The pressure developing device 6 has a pair of pressure rollers 6a, 6b and backup rollers 6c for energizing the upper pressure roller 6a toward the lower side. The backup rollers 6c make the distribution of pressure of the upper pressure roller 6a uniform in a direction of an axis.

The copying machine has a manual tray 7a and sheet cassettes 7b and 7c provided on the right side thereof.

Image receiving sheets 8 are housed in the manual tray 7a and the sheet cassettes 7b and 7c. At the time of forming images, the image receiving sheets 8 are fed from one of the manual tray 7a and the sheet cassettes 7b and 7c to the pressure developing device 6. Sheet feeding timing is the timing at which the image receiving sheet is superposed on the latent images formed on the photo and pressure sensitive sheet 2. The photo and pressure sensitive sheet 2 and the image receiving sheet 8 are pressurized by the pressure developing device 6 so that the uncured microcapsules are broken to flow the photocuring material, the dyestuff and the like onto the image receiving sheet 8. A coloring dyestuff is used. The coloring dyestuff reacts with a developer applied on the image receiving sheet 8 to form the images on the image receiving sheet 8. The developer mentioned above may be contained in the photo and pressure sensitive sheet (see Japanese Patent Unexamined Publication No. SHO 58-88739).

The pressure developing device 6 has a suction belt 9, a glossing device 10 and a discharge tray 11 provided on the downstream side thereof. A light source for exposure 12 is provided in an upper portion of the suction belt 9. The light source for exposure 12 irradiates the light on the image receiving sheet on which the images are formed. A low or high pressure mercury lamp, a fluorescent lamp, a tungsten lamp or the like can be used as the light source for exposure 12, by which the image receiving sheet 8 after pressure treatment is exposed. Consequently, the photocuring material flowed onto the image receiving sheet is cured (the photopolymerization initiator is activated to polymerize monomers), so that the toxicity of the monomers can be counteracted. The photocuring material which is generally used has a sensitivity peak in a region of ultraviolet rays. Therefore, a light source for emitting the ultraviolet rays such as the mercury lamp or the fluorsent lamp is especially effective. In addition, a photosensitivity region of the photocuring material is expanded to a region of visible rays by the sensitizer. Therefore, the light source for emitting the visible rays such as the tungsten lamp is also useful. The photosensitivity region is expanded by the sensitizer in order to directly use the light reflected by the original which is the visible ray.

The glossing device 10 heats and pressurizes the image receiving sheet developed by pressure (at a temperature of 70 to 160° C.). In the above step, the coloring reaction of the dyestuff is promoted and a thermoplastic resin applied on the image receiving sheet 8 covers the surface thereof so that the images are glossed. The glossed image receiving sheet is discharged to the discharge tray 11.

Figure 2:
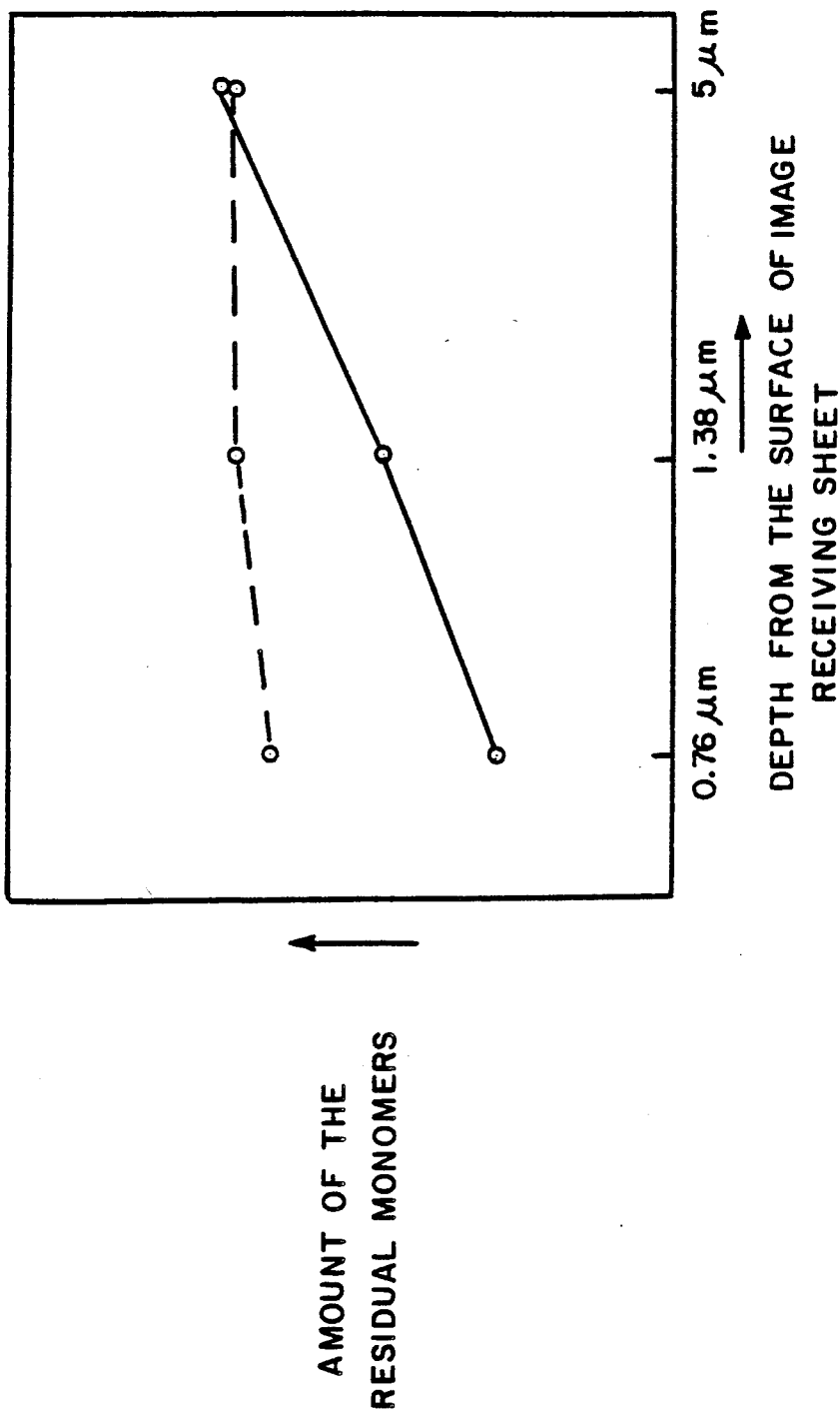
FIG. 2 is a view showing the comparison of an amount of residual monomers when exposure is performed after pressure treatment with an amount of residual monomers when the exposure is not performed after the pressure treatment.

FIG. 2 is a view showing an amount of residual monomers (harmful matters) in a direction of depth of the image receiving sheet 8 discharged to the outside of the copying machine when the light source for exposure 12 is used, in comparison with the amount of the residual monomers when the light source for exposure 12 is not used. The amount of the residual monomers in the direction of depth can be measured by a reflection spectrum obtained by changing an incident angle of infrared rays with use of a Fourier transform infrared spectrophotometer. In FIG. 2, a white dot shows the case in which the exposure is not performed, while a black dot shows the case in which the exposure is performed. As seen from FIG. 2, when the exposure is performed, the amount of the residual monomers are decreased on the surface which directly comes in touch with a human body. Therefore, there is no practical risk.

In the present embodiment, the light source for exposure may be provided behind the grossing device 10 which heats the pressurized image receiving sheet 8. It is sufficient that the pressurized image receiving sheet 8 is exposed before it is discharged from the copying machine so that the monomers are cured.

According to the present invention, the image receiving sheet is exposed before it is discharged from the image forming apparatus so that the monomers on at least the surface of the image receiving sheet are cured. Therefore, even if the user's skin touches the image receiving sheet discharged from the image forming apparatus, an eruption, a rash or the like can be prevented from appearing thereon. Furthermore, the security can be ensured with the simple construction in which a single light source is provided. In addition, an apparatus cost and a running cost are not increased very sharply.

What is claimed is:

1. An image forming apparatus comprising: optical means for forming a latent image on a photo and pressure sensitive sheet coated with uncured microcapsules in which at least a photocuring material and a dyestuff are enveloped;

pressure developing means for superposing the photo and pressure sensitive sheet on which the latent image is formed on an image receiving sheet and breaking said uncured microcapsules by pressure so that said dyestuff reacts with a developer on the image receiving sheet to form images on the image receiving sheet;

a light source for irradiating light on the image receiving sheet developed by the pressure developing means to photopolymerize material expelled from the broken microcapsules;

a glossing device for heating the image receiving sheet developed by the pressure developing means; and discharge means for discharging the image receiving sheet from the image forming apparatus after it has been irradiated by said light source.

2. An apparatus according to claim 1, further comprising an original platen on which an original is placed and wherein the optical means includes a light source unit which has a light source and a mirror and scans the original placed on the original platen with the light from the light source, and an optical unit which has a lens and a mirror for directing the light reflected by the original onto the photo and pressure sensitive sheet.

3. An apparatus according to claim 1, wherein the light source is a mercury lamp for emitting ultraviolet rays.

4. An apparatus according to claim 1, wherein the light source is a fluorescent lamp for emitting ultraviolet rays.

5. An apparatus according to claim 1, wherein the light source is a tungsten lamp for emitting visible rays.

* * * * *